United States Patent [19]

Tong et al.

[11] Patent Number: 5,536,994
[45] Date of Patent: Jul. 16, 1996

[54] PHOTORESIST FOR CATHODE RAY TUBES

[75] Inventors: Hua-Sou Tong, Arlington Heights, Ill.; Chun-Min Hu, Keelung; Yu-Chung Yu, Chungli, both of Taiwan

[73] Assignee: Chunghwa Picture Tubes, Ltd., Taoyuan, Taiwan

[21] Appl. No.: 424,907

[22] Filed: Apr. 19, 1995

[51] Int. Cl.$^6$ .............................. H01J 29/10; H01J 31/00
[52] U.S. Cl. ............................................. 313/461; 313/479
[58] Field of Search ..................................... 313/461, 479; 359/106, 507; 430/28, 197

[56] References Cited

U.S. PATENT DOCUMENTS

| | | | |
|---|---|---|---|
| 4,442,196 | 4/1984 | Iwaki et al. | 430/197 X |
| 4,491,629 | 1/1985 | Koike et al. | 430/28 X |
| 4,501,806 | 2/1985 | Watanabe et al. | 430/197 X |
| 5,041,570 | 8/1991 | Tochizawa et al. | 430/197 |
| 5,326,675 | 7/1994 | Niki et al. | 430/326 |

*Primary Examiner*—Walter E. Snow
*Assistant Examiner*—Mack Haynes
*Attorney, Agent, or Firm*—Emrich & Dithmar

[57] ABSTRACT

The inner surface of a video display panel such as cathode ray tube (CRT) glass faceplate is initially coated with a mixture of one of the primary color phosphors, an organic binder such as polyvinyl alcohol (PVA) diluted with water, and a photoresist agent. The organic binder overcomes the poor adhesion to the glass faceplate of the photoresist which typically includes polyvinyl pyrrolidone (PVP) and reduces the oxygen which decreases phosphor exposure time. To overcome PVA and PVP incompatibilities which give rise to nonuniform film thickness, a vinyl pyrrolidone-vinyl alcohol (VP-VA) copolymer is added to the phosphor, organic binder and photoresist mixture in the range of 0.1–30 wt %. The copolymer with both the VP and VA functioning groups serves as a coupling agent between the PVA and PVP and eliminates incompatibilities between these components. The VP-VA copolymer preferably has a VP/VA mole ratio in the range of 20/80 to 80/20.

9 Claims, 1 Drawing Sheet

PHOTORESIST FOR CATHODE RAY TUBES

FIELD OF THE INVENTION

This invention relates generally to video displays such as of the cathode ray tube (CRT)-type having a display screen with a light emitting phosphor, and is particularly directed to a photoresist coating for the inner surface of a display screen which provides improved video image contrast.

BACKGROUND OF THE INVENTION

The basic screen printing technique for the glass display screen of a CRT involves exposure of a light-sensitive colloid. The exposed area becomes insoluble and remains after development. On the other hand, in the black matrixing approach designed to improve color contrast, the matrix printing requires a process that has the reverse polarity because the matrix openings should be clear with the surrounding area black. This phosphor screening process involves the application of a photoresist applied to the display screen's inner surface. The photoresist typically includes polyvinyl pyrrolidone (PVP), 4,4"-diazidostilbene-2,2" disulfonic acid, disodium salt and water. Adhesion of this photoresist to the CRT glass faceplate has always been a problem giving rise to reduced production yields. To overcome this problem, polyvinyl alcohol (PVA) is added to the photoresist material. Addition of the PVA provides two benefits. First, adhesion between the photoresist and the glass faceplate is substantially improved. Secondly, addition of the PVA to the photoresist serves to depress the oxygen level, resulting in a decrease in the time required for the photoresist to be exposed to ultraviolet light for curing. However, because of an incompatibility between PVP and PVA, the addition of the PVA to the photoresist material makes it more difficult to apply the photoresist to the glass faceplate in the form of a thin film having a uniform thickness.

The present invention addresses the aforementioned problems encountered in the prior art by allowing for the addition of PVA to a photoresist coating solution providing a high degree of adhesion of the coating to a glass faceplate while allowing the coating to be applied to the faceplate in the form of a thin film of highly uniform thickness.

OBJECTS AND SUMMARY OF THE INVENTION

Accordingly, it is an object of the present invention to provide an improved photoresist material for coating the inner surface of the glass display panel of a video display device such as a CRT It is another object of the present invention to modify a conventional photoresist material so as to eliminate problems of incompatibility between the photoresist material components allowing the material to be applied to a glass display panel in the form of a thin film having a highly uniform thickness.

A further object of the present invention is to increase production yield in the manufacture of video display screens such as employed in a CRT by applying a photoresist coating to the surface of the display screen having a highly uniform thickness.

These objects of the present invention are achieved and the disadvantages of the prior art are avoided by a photoresist coating disposed on an inner surface of a glass video display panel, the photoresist coating including polyvinyl pyrrolidone (PVP) and polyvinyl alcohol (PVA), the improvement comprising: a vinyl pyrrolidone—vinyl alcohol (VP-VA) copolymer added to the photoresist coating to allow the photoresist coating to be applied to the glass video display panel as a thin film having a highly uniform thickness.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1:
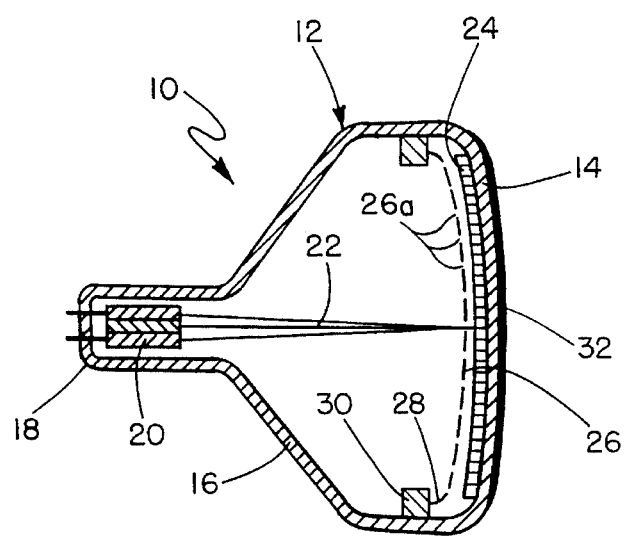
FIG. 1 is a longitudinal sectional view of a CRT incorporating a photoresist coating on the inner surface of its glass faceplate in accordance with the principles of the present invention.

Referring to FIG. 1, there is shown in sectional view of a color CRT 10 incorporating a phosphor-based photoresist coating 24 in accordance with the principles of the present invention. In the following discussion the terms "display screen", display panel" and "faceplate" are used interchangeably. CRT 10 includes a sealed glass envelope 12 having a forward faceplate or display screen 14, an aft neck portion 18, and an intermediate funnel portion 16. The photoresist coating 24 includes a plurality of discrete phosphor deposits, or elements, which emit light when an electron beam is incident thereon to produce a video image on the faceplate. Color CRT 10 includes three electron beams 22 directed onto and focused upon the CRT's glass faceplate 14. Disposed in the neck portion 18 of the CRT's glass envelope 12 are a plurality of electron guns 20 typically arranged in an inline array for directing the electron beams 22 onto the display screen 14. The electron beams 22 are deflected vertically and horizontally in unison across the phosphor-based photoresist coating 24 by a magnetic deflection yoke which is not shown in the figure for simplicity. Disposed in a spaced manner from phosphor screen 24 is a shadow mask 26 having a plurality of spaced electron beam passing apertures 26a and a skirt portion 28 around the periphery thereof. The shadow mask skin portion 28 is securely attached to a shadow mask mounting fixture 30 around the periphery of the shadow mask. The shadow mask mounting fixture 30 is attached to an inner surface of the CRT's glass envelope 12 and may include conventional attachment and positioning structures such as a mask attachment frame and a mounting spring which also are not shown in the figure for simplicity. The shadow mask mounting fixture 30 may be attached to the inner surface of the CRT's glass envelope 12 and the shadow mask 26 may be attached to the mounting fixture by conventional means such as weldments or a glass-based frit. Disposed on the outer surface of display screen 14 is an antistatic/antireflection coating 32.

Figure 2:
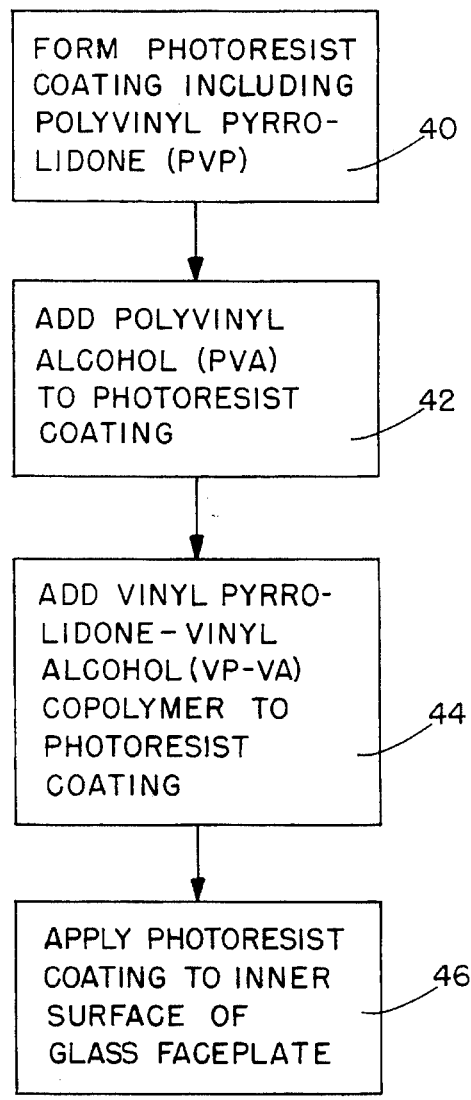
FIG. 2 is a flow chart illustrating the steps involved in preparing and applying a photoresist coating in accordance with the present invention to the inner surface of a video display glass faceplate.

Referring to FIG. 2, there is shown in block diagram form a flow chart illustrating the steps involved in preparing and applying a photoresist coating to the inner surface of a video display glass faceplate in accordance with the present invention. At step 40, the photoresist coating is formed so as to include polyvinyl pyrrolidone (PVP), 4, 4"-diazidostilbene-2, 2" disulfonic acid, disodium salt and water. To the photoresist coating containing the PVP, a polyvinyl alcohol (PVA) is added at step 42 to increase adhesion of the coating to the glass faceplate of a video display. The addition of the PVA not only increases adhesion of the photoresist coating to the glass faceplate, but also results in a reduction in oxygen permitting a reduced exposure period of the photoresist coating to ultraviolet light during curing following deposit on the glass faceplate. In order to overcome an incompatibility between the PVP and PVA, a vinyl pyrrolidone-vinyl alcohol (VP-VA) copolymer is added to the photoresist coating at step 44. The addition of the VP-VA copolymer in the range of 0.1–30 wt % to the photoresist coating overcomes the incompatibility between the PVP and PVA allowing the coating to be applied to the glass faceplate in the form of a thin film having a more uniform thickness over the faceplate's entire inner surface. The VP-VA copolymer is added to the photoresist coating in the range of 0.1–30 wt %. The copolymer has both the VP and VA functional groups which serve as a coupling agent bridging PVP and PVA together for essentially eliminating the incompatibility problem between the PVA and PVP. The VP-VA copolymer added to the photoresist coating preferably has a VP/VA mole ratio in the range of 20/80 to 80/20. A specific example of a photoresist coating in accordance with the present invention has the following composition:

Azide: 0.5 gr.
PVP: 5 gr.
PVA: 2.5 gr.
Water: 100 gr.
VP-VA: 5.0 wt %

There is thus been shown an improved photoresist coating for the inner surface of a video display panel such as in a CRT which has a high degree of adhesion to the glass display panel and can be applied to the inner surface of the display panel in the form of a thin film having a high degree of uniformity in thickness. The photoresist coating includes PVP to which is added PVA to increase adhesion between the photoresist coating and the glass display panel as well as to reduce the oxygen to permit a decrease in the exposure time of the photoresist to ultraviolet light during curing. Incompatibilities between the PVP and PVA are compensated for by the addition of a VP-VA copolymer to permit the photoresist coating to be applied to the the display panel's inner surface in the form of a thin film having a highly uniform thickness.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. In a photoresist coating disposed on an inner surface of a glass video display panel, said photoresist coating including polyvinyl pyrrolidone (PVP) and polyvinyl alcohol (PVA), the improvement comprising:

a vinyl pyrrolidone—vinyl alcohol (VP-VA) copolymer added to said photoresist coating to allow said photoresist coating to be applied to said glass video display panel as a thin film having a highly uniform thickness.

2. The improvement of claim 1 wherein said VP-VA copolymer is added to said photoresist coating in the range of 0.1–30 wt %.

3. The improvement of claim 2 wherein said VP-VA copolymer has a VP/VA mole ratio in the range of 20/80 to 80/20.

4. A method for preparing a photoresist coating for use on an inner surface of a glass video display panel, said method comprising the steps of:

forming a coating solution comprised of polyvinyl pyrrolidone (PVP), 4-4"-diazidostilbene- 2,2", disulfonic acid, disodium salt, and water;

adding polyvinyl alcohol (PVA) to said coating solution to improve adhesion of said coating solution to the glass video display panel; and adding a vinyl pyrrolidone-vinyl alcohol (VP-VA) copolymer to said coating solution, wherein said VP-VA copolymer serves as a coupling agent between said PVP and PVA for allowing said coating solution to be applied to the glass video display panel in the form of a thin film having a highly uniform thickness.

5. The method of claim 4 further including the step of adding said VP-VA copolymer in the range of 0.1–30 wt % of said coating solution.

6. The method of claim 5 wherein said VP-VA copolymer has a VP-VA mole ratio in the range of 20/80 to 80/20.

7. A cathode ray tube glass faceplate having a coating on an inner surface thereof comprising:

a photoresist coating solution including polyvinyl pyrrolidone (PVP) disposed on the inner surface of the glass faceplate;

polyvinyl alcohol (PVA) disposed in said photoresist coating for adhering said photoresist coating to the glass faceplate; and a vinyl pyrrolidone-vinyl alcohol (VP-VA) copolymer disposed in said photoresist coating for allowing said photoresist coating to be applied to the glass faceplate as a thin film having a highly uniform thickness.

8. The cathode ray tube faceplate of claim 7 wherein said VP-VA copolymer is in the range of 0.1–30 wt % of said photoresist coating.

9. The cathode ray tube faceplate of claim 8 wherein said VP-VA copolymer has a VP/VA mole ratio in the range of 20/80 to 80/20.

* * * * *

UNITED STATES PATENT AND TRADEMARK OFFICE
CERTIFICATE OF CORRECTION

PATENT NO. : 5,536,994
DATED : 7/16/96
INVENTOR(S) : HUA-SOU TONG ET AL.

It is certified that error appears in the above-indentified patent and that said Letters Patent is hereby corrected as shown below:

COLUMN 2, LINE 54, "SKIN" SHOULD BE --- SKIRT --.

Signed and Sealed this

Eighth Day of October, 1996

*Attest:*

BRUCE LEHMAN

*Attesting Officer*     *Commissioner of Patents and Trademarks*